Feb. 2, 1960 W. R. AIKEN 2,923,887

ELECTRONIC CIRCUIT ARRANGEMENT FOR THE CONTROLLED AMPLIFICATION OF A DESIRED SIGNAL

Filed Nov. 29, 1955 2 Sheets-Sheet 1

INVENTOR.
William Ross Aiken.
BY
Patent Agent.

Feb. 2, 1960 W. R. AIKEN 2,923,887

ELECTRONIC CIRCUIT ARRANGEMENT FOR THE CONTROLLED AMPLIFICATION OF A DESIRED SIGNAL

Filed Nov. 29, 1955 2 Sheets-Sheet 2

INVENTOR.
William Ross Aiken.

BY

K. A. Vaughan

Patent Agent.

2,923,887
Patented Feb. 2, 1960

2,923,887

ELECTRONIC CIRCUIT ARRANGEMENT FOR THE CONTROLLED AMPLIFICATION OF A DESIRED SIGNAL

William Ross Aiken, Los Altos, Calif., assignor to Ross Radio Corporation, Los Altos, Calif., a corporation of California Application November 29, 1955, Serial No. 549,752

12 Claims. (Cl. 330—10)

Figure 1:
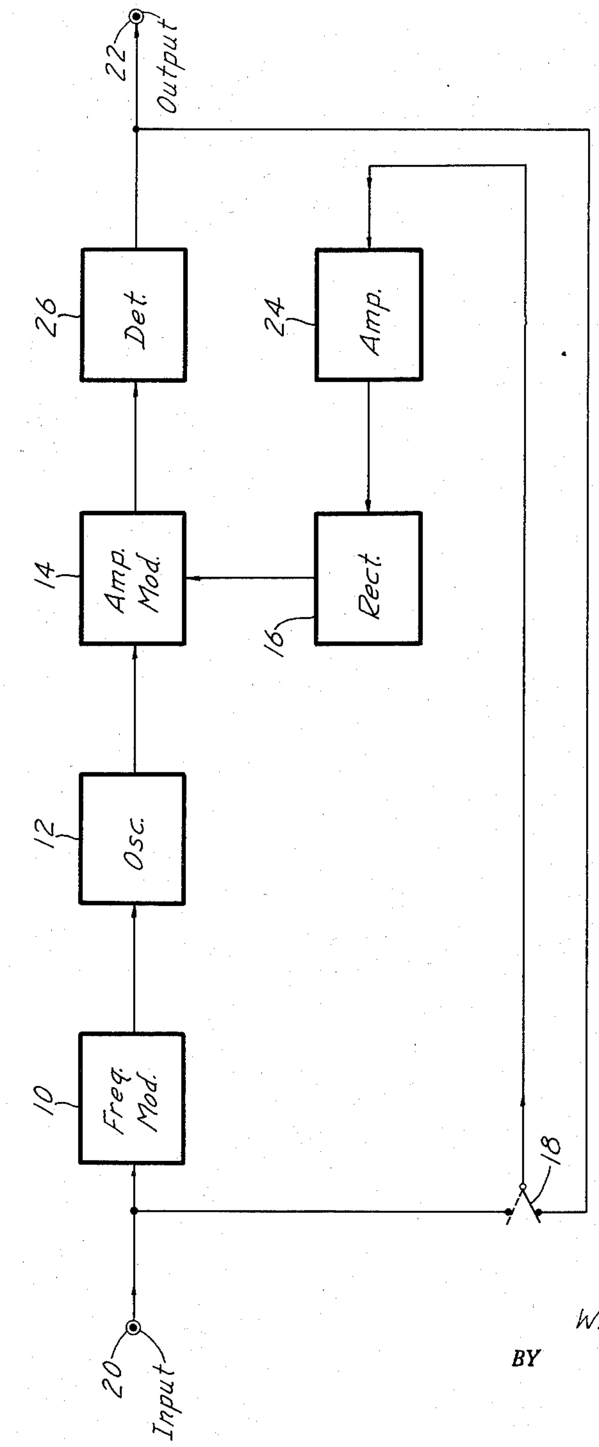

The present invention relates to electronic circuit arrangements for the controlled amplification of a desired signal. More particularly the present invention relates to circuit arrangements, of the type referred to, wherein the amplification factor is controlled by means of a control voltage that is either derived from the signal voltage itself or which may be derived from an independent source, such as a separately transmitted control signal.

Many circuits have been designed to effect controlled amplification of a desired signal but they all suffer from a variety of serious defects. One such defect is the fact that the control voltage may appear in the output of the amplifier and may be many times larger than the desired signal. Attempts have been made to reduce this undesirable effect by restricting the speed of the control operation, so that the frequency of the control voltage lies decidedly below the frequency band of the signal voltage and may therefore be filtered out without detriment to the desired signal voltage. In this manner interfering effects of the control voltage in the output of the amplifier may be avoided. Push pull circuits or balanced modulator circuits have been used to cancel out the control voltage in the output of amplifiers. These remedies make it necessary, however, to restrict the control circuits to low speed operation, and in addition it is usually necessary to operate amplifiers of this type at very low volume levels to maintain distortion within tolerable limits. In general, known volume control arrangements have been slow in operation, of restricted band width, delicate in balance and subject to considerable distortion.

It is an object of my invention to provide an electronic circuit arrangement for the amplification of desired signals that exhibits none of the above mentioned ills.

More specifically, it is an object of my invention to provide an electronic circuit arrangement for the controlled amplification of incoming signals, that operates extremely fast yet produces no undesirable noise in the output.

Still another object of my invention is to provide an electronic amplifier, of the type referred to, that is capable of operating without the above mentioned defects over the frequency band which is wide enough to allow its use in the video portion of television receivers and stations.

Furthermore, it is an object of my invention to provide an electronic amplifier, of the type referred to, for use in television stations, that gives non-linear amplification so that an improvement in "gray scale" is obtained.

To amplify a desired signal in accordance with my invention I generate a selected carrier, I modulate said carrier in accordance with the desired signal in a first manner of modulation, I then modulate the signal-modulated carrier in a second manner of modulation in accordance with an amplification control voltage, which may be derived from the desired signal itself or from an independent source, and I then demodulate the doubly modulated carrier simultaneously with respect to both modulations in such a manner that the control voltage appears only in combination with the desired signal but is not demodulated by itself.

Figure 2:
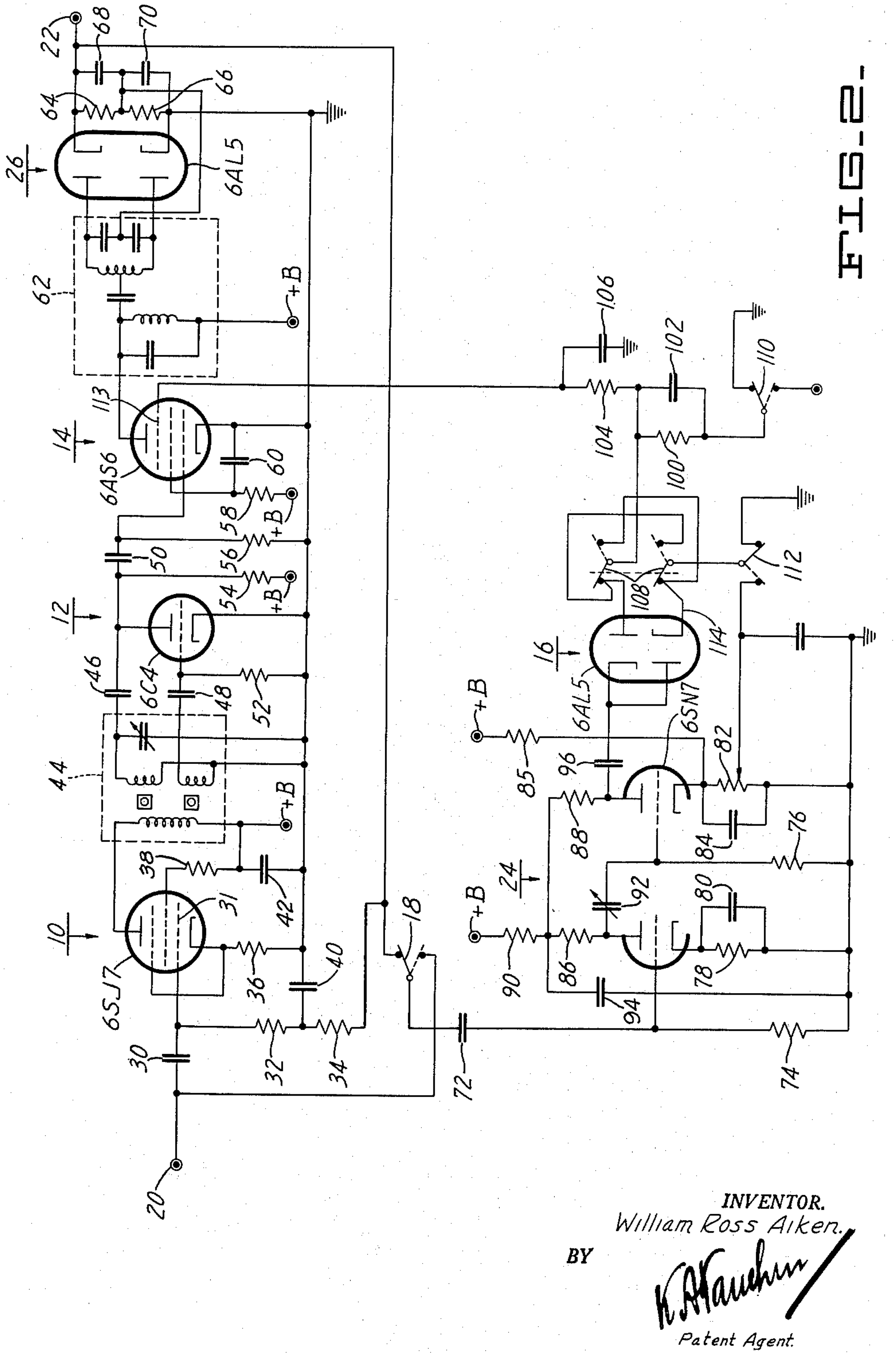

The above stated objects and other objects of my invention will be apparent from the following description of the accompanying drawings which illustrate a preferred embodiment of my invention and wherein:

Figure 1 is a block diagram of an electronic circuit arrangement for the amplification of a desired signal constructed in accordance with my invention, and Figure 2 is a circuit diagram illustrating in detail a practical embodiment of my invention.

Having first reference to Figure 1, the circuit arrangement embodying my invention comprises a modulator 10 to whose control electrode the desired signal is delivered. In the particular embodiment of the invention illustrated in Figure 1 the modulator 10 is a frequency modulator. The circuit arrangement of the invention also includes an oscillator 12 which is arranged to generate a selected carrier frequency, such as 10 megacycles. The modulator 10 is connected to oscillator 12 in such a manner that the carrier generated by said oscillator is frequency-modulated in accordance with the desired signal. The frequency-modulated carrier is then passed to a second modulator which is indicated by the block 14 and which is an amplitude modulator. In said amplitude modulator the frequency-modulated carrier is amplitude-modulated in accordance with an amplification control voltage derived from a suitable source indicated by the block 16. In the particular embodiment of the invention illustrated in Figure 1, said source of control voltage is a rectifier and depending upon the manner in which the circuit arrangement of the invention is to be employed, i.e. whether it is to operate as a voltage expander or a voltage compressor, a manually operable switch 18 may be set to apply the signal voltage at the input 20 of the circuit arrangement or the voltage at the output 22 of the circuit arrangement through a suitable amplifying stage 24 to the rectifier 16. When the arrangement of the invention is to be employed as an expander, it is the signal voltage at the input 20 which is delivered to the rectifier 16 and said rectifier is arranged to apply a positive control voltage to the amplitude modulator 14. On the other hand, when the circuit arrangement of the invention is to operate as a compressor or limiter, it is the voltage at the output 22 of the arrangement which is delivered to the rectifier 16 and the rectifier is arranged to apply a negative control voltage to the amplitude modulator 14. As a third alternative, the voltage delivered to the rectifier 16 may be derived from an independent source, such as a separately obtained control signal.

The frequency and amplitude-modulated carrier is then delivered to a demodulator 26 which responds to both, the frequency and the amplitude of the carrier, such as a Foster-Seeley type detector. In such a demodulator the control voltage will not produce a signal in the absence of a frequency modulation signal. It will only produce the original signal at a volume level that is determined by the amplitude modulation. However, the quiescent or zero amplitude of the carrier should be adjusted to the center frequency of the modulator, so that any D.C. component that might occur in the modulated signal may be balanced out in the demodulator and not appear in the output.

A practical embodiment of the invention as represented by the block diagram of Figure 1 is illustrated in detail in the circuit diagram of Figure 2. The frequency modulator stage 10 is formed by a frequency modulator tube 6SJ7. The desired signal is applied to the grid 31 of said tube through a coupling condenser 30 which has a capacity of .5 microfarad. Grid return resistor 32 is .51 megohm, frequency stabilizing resistor 34 is .1 megohm, cathode bias resistor 36 is 680 ohms, and the screen dropping resistor 38 is 180,000 ohms. 40 is a frequency correction filter condenser which has a capacity of 2 microfarads, and 42 is a screen by-pass condenser of .5 microfarad.

The oscillator stage 12 is formed by an oscillator tube 6C4. The reference numeral 44 designates a transformer comprising a saturable reactor oscillator coil capable of operation in a frequency modulation circuit. Transformers of this type are well known in the art. The coupling condenser 46 has a capacity of .002 microfarad. The grid condenser 48 has a capacity of 100 micromicrofarads. The output coupling condenser 50 also has a capacity of 100 micromicrofarads. The grid bias resistor 52 is 100,000 ohms and the plate resistor 54 is 10,000 ohms.

The amplitude modulator stage 14 is formed by an amplitude modulator tube 6AS6. This tube operates also as a limiter to stabilize the amplitude of the frequency-modulated carrier before it is amplitude-modulated. The amplitude modulator stage comprises a grid return resistor 56 of 39,000 ohms, a screen dropping resistor 58 of 100,000 ohms and a screen by-pass condenser 60 of .01 microfarad.

The demodulator stage 26 is formed by a detector tube 6AL5. The reference numeral 62 indicates a detector transformer of a type well known in the art. The resistors 64 and 66 are each 100,000 ohms, and the condensers 68 and 70 have each a capacity of 100 micromicrofarads.

The amplifier stage 24 is formed by a tube 6SL7 or 6SN7. Its input coupling condenser 72 has a capacity of .1 microfarad. Grid return resistor 74 is 51 megohms, grid return resistor 76 is 150,000 ohms. Cathode resistor 78 is 27,000 ohms and is shunted by a condenser 80 which has a capacity of 50 microfarads. The second cathode resistor is formed by a potentiometer 82 which is shunted by a condenser 84 of 20 microfarads. 85 is a dropping resistor of 25,000 ohms intended to provide a fixed voltage across potentiometer 82. The plate resistors 86 and 88 are 100,000 and 51,000 ohms respectively. 90 is a decoupling resistor 90 of 51,000 ohms. Coupling condenser 92 has a capacity of .1 microfarad. 94 is decoupling condenser of 8 microfarads. 96 designates the coupling condenser to the rectifying stage 16, which condenser has a capacity of .1 microfarad.

The rectifier stage 16 is of the conventional voltage doubler type and comprises a rectifier tube 6AL5. A resistor 100 of 510,000 ohms shunted by a condenser 102 of 1 microfarad in conjunction with a resistor 104 of 1 megohm and a condenser 106 of 1 microfarad form the load for the rectifier and serve to determine its time constant, which should be high compared with the fluctuations of the desired signal. The two-pole switch 108 serves to reverse the polarity of the rectified voltage depending on whether the system of the invention is employed for volume compression or volume expansion. When the initially mentioned switch 18 is set to apply the voltage at the output 22 of the system to the amplifier 24, as shown in full lines in Figures 1 and 2, the system will operate as a volume compressor and in this case the switch 108 should be in the position shown in full lines in Figure 2. On the other hand, if the system is to operate as a volume expander, the switch 18 and the switch 108 should be set to the positions shown in broken lines in Figures 1 and 2. In such a case a switch 110 may be moved from the position shown in full lines in Figure 2 to the position indicated in broken lines in said Figure 2 to change the bias voltage applied to the control grid 113 of the amplitude modulator tube in order that the control system may start to operate at less than full gain.

When the illustrated embodiment of the invention is set for compressor use, with the switches 18 and 108 in the positions shown in full lines, a switch 112 may be moved from the neutral position illustrated in Figure 2 to its other pole of contact to apply a delay voltage from potentiometer 82 to the cathode 114 of the rectifier tube. This changes the operation of the system from that of an ordinary volume compressor to that of a peak limiter at a peak level determined by the setting of potentiometer 82. In practice the switches 18, 108 and 110 may be ganged to operate simultaneously, while switch 112 should be arranged for individual manipulation so that the arrangement of the invention may selectively be used not only as volume expander or volume compressor, but may, when set for use as volume compressor, it will be operated as a compressor in the ordinary meaning of the word or as peak limiter of desired level.

It should be noted that in the embodiment of the invention illustrated in Figure 2 the output 22 is connected to the input 20 through the hereinbefore mentioned resistors 32 and 34. This is effective to stabilize the center or quiescent frequency of the oscillator 12 at the center frequency of the detector stage 26.

The power supply for the circuit arrangement of my invention is of conventional design and has therefore been omitted from the diagrams.

The circuit arrangement of my invention may be operated at high volume levels with extremely low distortion. Its control function may be made to operate extremely fast without the appearance of undesirable noises in the output, and it is capable of operating satisfactorily over a frequency band that is wide enough to permit its use in the video portions of television stations and receivers. It may be made to operate as a non-linear amplifier, such as a logarithmic pulse amplifier.

While the exemplary embodiment of my invention illustrated in the accompanying drawings and described in the above specification is shown as comprising a frequency modulator stage, an oscillator stage and a separate amplitude modulator stage, it will be understood by those skilled in the art that the functions of the amplitude modulator and of the oscillator may be combined in a single stage. Also, while the circuit arrangement as illustrated and described employs an amplitude control voltage that is directly or indirectly derived from the incoming signal at the input or output respectively of the system, it will be understood, as has been pointed out hereinbefore, that the control voltage may be derived from an independent source, such as a separately obtained control signal.

While I have explained my invention with the aid of a particular embodiment thereof, it will be understood that the invention is neither limited to the specific circuits illustrated and described nor to the particular values given for the circuit components, all of which may be departed from without departing from the spirit and scope of my invention.

What I claim is:

1. An amplifier circuit for amplifying an incoming signal in a controlled manner comprising a first modulator stage, means including an input terminal for coupling the incoming signal to said first modulator stage, a carrier-generating stage, means for coupling the output signal of said first modulator stage to said carrier-generating stage to modulate the carrier with said output signal, a second modulator stage for modulating the signal output of said carrier-generating stage in a second manner of modulation, means for coupling the output of said carrier-generating stage to said second modulator stage, a demodulator stage for demodulating the doubly modulated carrier with respect to both modulations, said demodulator stage having an output terminal, means for coupling the signal output of said second modulator stage to said demodulator stage, a voltage rectifier, switch means selectively operable to connect one of said terminals to said rectifier, and means coupling the output of said rectifier to said second modulator stage to selectively control the modulation effected thereby in accordance with the strength of the incoming signal or the strength of the output signal of said demodulator stage.

2. An electronic volume expander comprising a frequency modulator stage having input means for receiving an incoming signal, an oscillator for generating a carrier, means for coupling the signal output of said frequency modulator stage to said oscillator to frequency-modulate the carrier generated by said oscillator in accordance with the incoming signal, an amplitude modulator stage, means for coupling the output signal of said oscillator to said amplitude modulator stage for amplitude-modulating the frequency-modulated output signal of said oscillator, a rectifier, means for applying the signal voltage at the input means of said frequency modulator stage to said rectifier, means for coupling the voltage output of said rectifier to said amplitude modulator stage to control the modulation effected thereby in accordance with the voltage output of said rectifier, a demodulator stage for demodulating the doubly modulated carrier with respect to both modulations, and means for coupling the doubly modulated output signal of said amplitude modulator stage to said demodulator stage.

3. An electronic volume compressor comprising a frequency modulator stage having input means for receiving an incoming signal, an oscillator for generating a carrier, means for coupling the signal output of said frequency modulator stage to said oscillator to frequency-modulate the carrier generated by said oscillator in accordance with the incoming signal, an amplitude modulator stage, means for coupling the output signal of said oscillator to said amplitude modulator stage to amplitude-modulate the frequency-modulated output signal of said oscillator, a demodulator stage for demodulating the doubly-modulated carrier with respect to both modulations, said demodulator stage having output means, means for coupling the output signal of said amplitude modulator stage to said demodulator stage, a rectifier, means for applying the signal voltage at the output means at said demodulator stage to said rectifier, and means for applying the voltage output of said rectifier to said amplitude demodulator stage to control the modulation effected thereby in accordance with the signal voltage at said output means.

4. A circuit arrangement according to claim 2 wherein said rectifier has a time constant that is high compared with the fluctuations of the incoming signal.

5. Circuit arrangement according to claim 3 for use as a peak limiter wherein said rectifier comprises means for establishing a delay bias to prevent the rectifier from delivering a control voltage to said amplitude modulator stage for signal output levels below a predetermined value.

6. A volume expander according to claim 2 wherein said demodulator stage has output means and comprising means effectively connecting said output means to said input means to stabilize the center frequency of said oscillator at the center frequency of said demodulator stage.

7. A volume expander according to claim 3 comprising means effectively connecting said output means to said input means to stabilize the center frequency of said oscillator at the center frequency of said demodulator stage.

8. An amplifier circuit comprising an input path over which frequency-modulated signals are received, a modulator stage for modulating the frequency-modulated signals in a second manner of modulation, means for coupling the frequency-modulated signals received over said path to said modulator stage, a demodulator stage for demodulating the doubly-modulated signals with respect to both modulations, means for coupling the signal output of said modulator stage to said demodulator stage, and means for coupling the signal output of said demodulator stage as a control voltage to said modulator stage to control the modulation of the incoming signals effected thereby.

9. An amplifier unit for amplifying a selected signal, said unit comprising a carrier generating stage, a first modulator stage for modulating the carrier generated by said carrier-generating stage in a first manner of modulation, means for applying the selected signal to said first modulator stage to modulate the carrier generated by said carrier-generating stage with the selected signal in a first manner of modulation, a second modulator stage of a type different from said first modulator stage, means for applying a control signal to said second modulator stage, means for delivering the carrier modulated in said first modulator stage to said second modulator stage so as to modulate said modulated carrier with said control signal in a second manner of modulation different from said first manner of modulation, a demodulator stage capable of separating both said modulations simultaneously from said carrier, and means for delivering the doubly modulated carrier to said demodulator stage to reproduce the selected signal in combination with said control signal.

10. A circuit arrangement according to claim 9 wherein one of said modulator stages is a frequency modulator and the other is an amplitude modulator.

11. An amplifier unit for amplifying a selected signal in a controlled manner, said unit comprising a carrier-generating stage, a frequency modulator stage for frequency-modulating the carrier generated by said carrier-generating stage, means for delivering the selected signal to said frequency modulator stage, to frequency-modulate the carrier generated by said carrier-generating stage with the selected signal, an amplitude modulator stage, means for applying a control signal to said amplitude modulator stage, means for delivering the frequency-modulated carrier to said amplitude modulator stage to amplitude-modulate said frequency-modulated carrier with said control signal, a Foster-Seeley demodulator stage, and means for delivering the doubly modulated carrier to said demodulator stage to reproduce the selected signal in combination with the control-signal.

12. A circuit arrangement according to claim 11 wherein the carrier and the center frequency of said demodulator stage are adjusted to the same value.

References Cited in the file of this patent

UNITED STATES PATENTS

| | | |
|---|---|---|
| 2,407,259 | Dickieson | Sept. 10, 1946 |
| 2,455,332 | Hare | Nov. 30, 1948 |
| 2,472,798 | Fredendall | June 14, 1949 |
| 2,672,589 | McLeod | Mar. 16, 1954 |